US009887682B2

(12) United States Patent
Den et al.

(10) Patent No.: US 9,887,682 B2
(45) Date of Patent: Feb. 6, 2018

(54) REGULATING CIRCUIT AND OPTIMIZING CIRCUIT

(71) Applicant: HON HAI PRECISION INDUSTRY CO., LTD., New Taipei (TW)

(72) Inventors: Shii-Rong Den, New Taipei (TW); Ming-Hsien Hsu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/183,187

(22) Filed: Jun. 15, 2016

(65) Prior Publication Data
US 2016/0373082 A1 Dec. 22, 2016

(30) Foreign Application Priority Data

Jun. 18, 2015 (TW) .................................. 104119769

(51) Int. Cl.
*H03H 7/40* (2006.01)
*H03H 7/38* (2006.01)

(52) U.S. Cl.
CPC ......... *H03H 7/40* (2013.01); *H03H 2007/386* (2013.01)

(58) Field of Classification Search
CPC .. H03H 7/40; H03H 7/38; H03H 7/19; H03H 17/08; H03H 7/383; H03H 7/46; H04B 1/0458; H01P 1/18
USPC .............................. 333/124, 125, 139, 32, 33
See application file for complete search history.

(56) References Cited

U.S. PATENT DOCUMENTS

| 7,633,355 | B2 * | 12/2009 | Matsuo | H03H 7/40 333/17.3 |
| 8,620,236 | B2 * | 12/2013 | Manssen | H01Q 1/242 455/115.1 |
| 8,710,927 | B2 * | 4/2014 | Kamitani | H03F 1/0277 330/124 R |
| 8,922,305 | B2 * | 12/2014 | Oran | H01P 1/20336 333/205 |
| 2008/0238569 | A1 | 10/2008 | Matsuo | |
| 2012/0044026 | A1 * | 2/2012 | Fukuda | H03F 3/19 333/33 |

FOREIGN PATENT DOCUMENTS

TW 200840137 A1 10/2008

\* cited by examiner

*Primary Examiner* — Dean Takaoka
*Assistant Examiner* — Alan Wong
(74) *Attorney, Agent, or Firm* — ScienBiziP, P.C.

(57) ABSTRACT

A regulating circuit is configured to adjust current consumptions. The regulating circuit comprises a switch and at least two matching circuits. The at least two matching circuits are configured to match different input signals and reduce current consumptions. The switch is coupled to the at least two matching circuits. According to different input signals, the switch switches on one matching circuit and switches the other matching circuits off. Each matching circuit comprises a transmission line and a varactor. The transmission line is coupled to the switch. The transmission line is configured to adjust a phase angle in a Smith chart quadrant. The varactor is configured to further adjust the phase angle. Thus the phase angle is adjusted to a predetermined position in the certain quadrant. An optimizing circuit is also provided. In the present disclosure, different input signals can be transmitted in a corresponding matching circuit to optimize current consumptions.

3 Claims, 4 Drawing Sheets

REGULATING CIRCUIT AND OPTIMIZING CIRCUIT

CROSS-REFERENCE TO RELATED APPLICATIONS

This application claims priority to and benefit of Taiwanese Patent Application No. 104119769 filed on Jun. 18, 2015, which is hereby incorporated by reference in its entirety for all purposes.

FIELD

The subject matter herein generally relates to a regulating circuit, particularly relates to a regulating circuit and an optimizing circuit both to optimize current consumption.

BACKGROUND

Nowadays, Long Term Evolution (LTE) systems are widely applied to some communication products, such as mobile phones. In an LTE system, current consumption is one of main effectiveness indexes. People are focusing on reducing current to decrease power consumptions. However, it is hard for people to reduce the current consumptions because of too many factors influencing the current consumption in the LTE systems. Among the factors, an amplifier using is the most important factor influencing the current consumption. Further, it takes lots of time to get the best load pull value in an amplifier.

SUMMARY

In one aspect of the disclosure, a regulating circuit is configured to adjust current consumptions. The regulating circuit comprises at least two matching circuits and a switch. In order to reduce current consumptions, the at least two matching circuits are configured to be matched to different input signals. The switch is coupled to the at least two matching circuits. The switch is configured to select one matching circuit and correspondingly switch on the selected matching circuit according to the different input signals.

Each matching circuit comprises a transmission line and a varactor diode. The transmission line is coupled to the switch. The transmission line is configured to adjust phase angles to a certain quadrant in the four Smith chart quadrants. The varactor diode is configured to further adjust the phase angles to a predetermined position in the certain quadrant.

BRIEF DESCRIPTION OF THE DRAWING

Implementations of the present technology will now be described, by way of example only, with reference to the attached figures, wherein.

DETAILED DESCRIPTION

Figure 1:
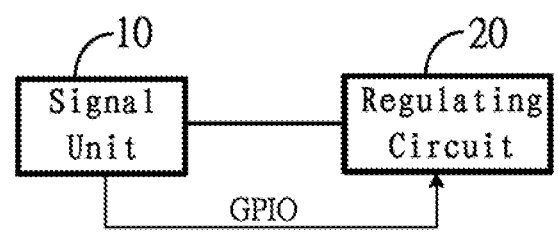
FIG. 1 illustrates a diagrammatic view of a first embodiment of an optimizing circuit.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Several definitions that apply throughout this disclosure will now be presented. The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

The present disclosure is described in relation to a regulating circuit and an optimizing circuit. In the present disclose, the optimizing circuit is used to regulate current consumptions in systems or devices. The system or the device could be some wireless communication products, such as mobile phones, routers, base stations, repeaters and so on.

FIG. 1 illustrates a diagrammatic view of a first embodiment of an optimizing circuit.

Referring to FIG. 1, in at least one embodiment, the optimizing circuit comprises a signal unit 10 and a regulating circuit 20. The signal unit 10 is configured to generate and transmit signals and output control signals. In a system or in a device, the signal unit 10 can be a signal amplifier or a signal processor used to adjust signals. The signal unit 10 can be coupled to the regulating circuit 20 through some control buses. The signal unit 10 then controls the regulating circuit 20. In order to reduce the current consumption, the signal unit 10 outputs control signals to the regulating circuit 20 according to signal detected statuses. The control bus can be General Purpose Input Output (GPIO) ports.

Figure 2:
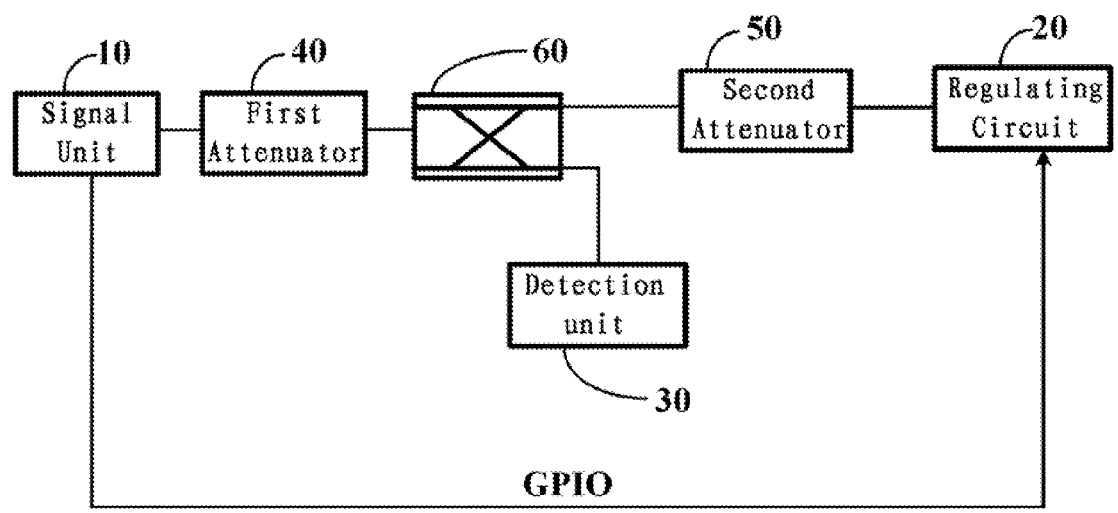
FIG. 2 illustrates a diagrammatic view of a second embodiment of an optimizing circuit.

FIG. 2 illustrates a diagrammatic view of a second embodiment of an optimizing circuit.

The difference between the first embodiment and the second embodiment is that, the optimizing circuit in the second embodiment further comprises a signal unit 10, a regulating circuit 20, a first attenuator 40, a second attenuator 50, a coupler 60 and a detection unit 30. The first attenuator 40 is coupled to the signal unit 10, and the first attenuator 40 is configured to adjust amplitude of signals output from the signal unit 10.

The coupler 60 is coupled to the first attenuator 40, and the coupler 60 is configured to split signals. The second attenuator 50 is coupled to the coupler 60, and the second attenuator 50 is configured to reduce insertion loss values in optimizing circuit components. The detection unit 30 is coupled to the coupler 60, and the detection unit 30 is configured to detect signal statuses of signals output from the signal unit 10. The signal unit 10 controls the regulating circuit 20 according to the signal statuses. The signal statues comprise signal frequencies, current consumption, an Adjacent Channel Leakage Ratio (ACLR) and so on.

Figure 3:
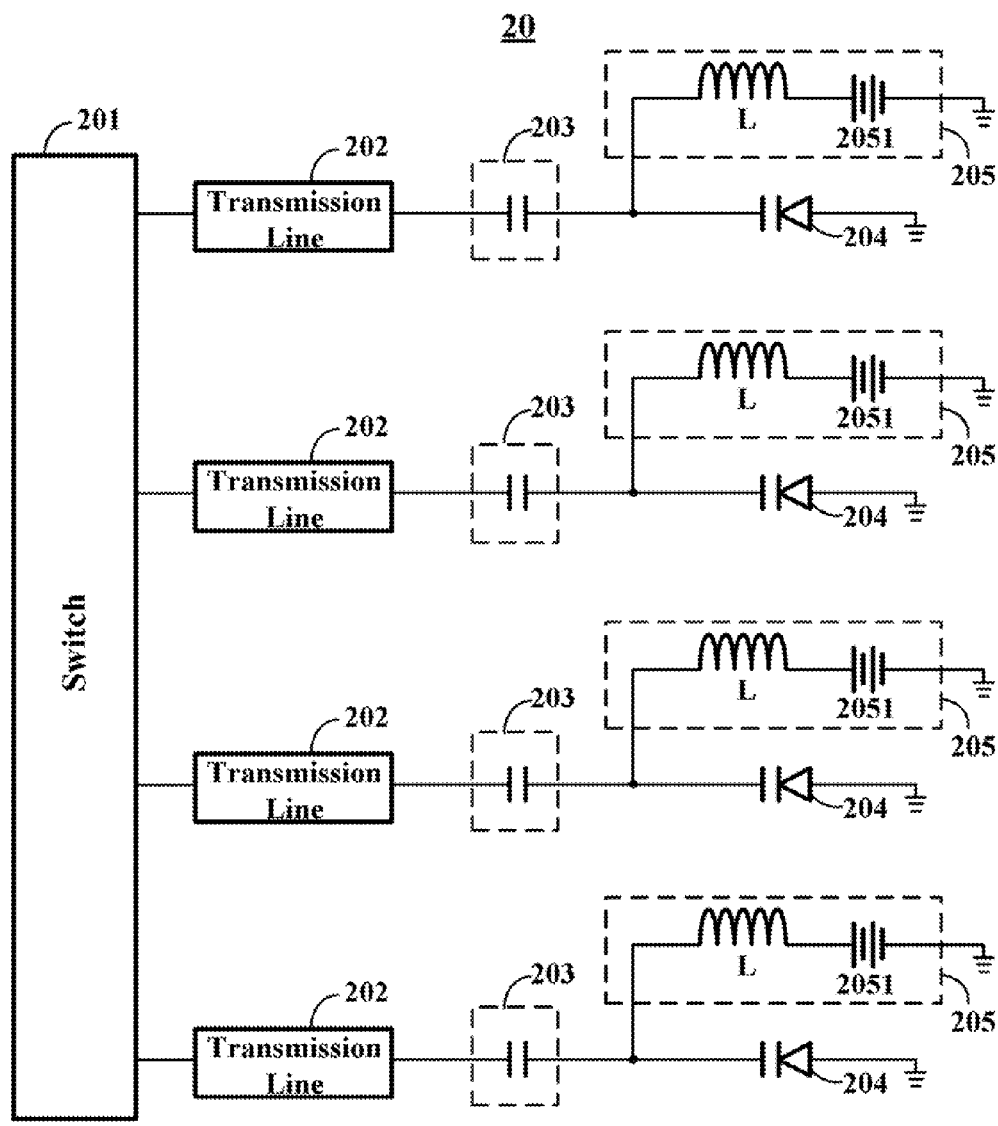
FIG. 3 illustrates a diagrammatic view of one embodiment of a regulating circuit.

FIG. 3 illustrates a diagrammatic view of one embodiment of a regulating circuit 20.

In at least one embodiment, the regulating circuit 20 is configured to adjust current consumptions. The regulating circuit 20 comprises at least two matching circuits and a switch 201. Each matching circuit is configured to be matched to different input signals. The switch 201 is coupled to all the matching circuits, and the switch 201 is configured to select one matching circuit and correspondingly switch on the selected matching circuit according to the different input signals. In the regulating circuit 20, different input signals can be transmitted through certain matching circuits correspondingly. Thus, the current consumptions can be reduced.

Each matching circuit comprises a transmission line 202, a varactor diode 204 and a block unit 203. The transmission line 202 is coupled to the switch 201, and the transmission line 202 is configured to adjust phase angles. In at least one embodiment, the transmission line 202 is a micros-trip line with a certain width. Moreover, different transmission lines 202 in the at least two matching circuits have different length. Thus, when input signals are transmitted through the different transmission lines 202, the phase angles are located in a certain quadrant in four Smith chart quadrants. The varactor diode 204 is configured to have a further adjustment on the phase angles. Thus, the phase angles are adjusted to a predetermined position in the certain quadrant. When the phase angles are adjusted to the predetermined position, the current consumption is greatly reduced. The block unit 203 is coupled to the transmission line 202 and the varactor diode 204, and the block unit 203 is configured to separate direct current in the input signals. In at least one embodiment, the block unit 203 can be a high voltage resistive capacitor.

In the embodiment, each matching circuit can further comprise a biasing circuit 205 according to a requirement. The biasing circuit 205 is coupled to the block unit 203 and the varactor diode 204. The biasing circuit 205 is configured to adjust a varactor diode biasing voltage. Thus, the phase angles can be adjusted. In each matching circuit, the biasing circuit 205 comprises a Direct Current (DC) power 2051 and an inductor L. The DC power 2051 can be an output terminal in a certain power or a DC source. The DC power voltage is configured to provide a predetermined voltage. The DC power voltage can be adjusted from 0 volt to 15 volts. The inductor L is coupled to the DC power 2051, the block unit 203 and the varactor diode 204. The inductor L is configured to adjust the DC power voltage.

Figure 4:
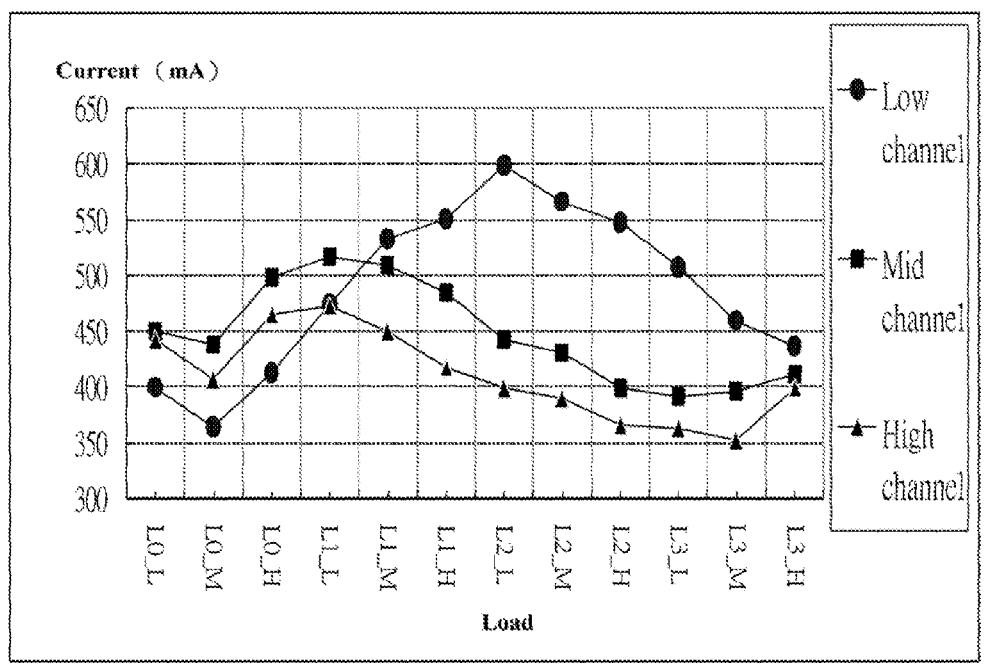
FIG. 4 illustrates a current consumption measuring diagram of one embodiment of an optimizing circuit.

FIG. 4 illustrates a current consumption measuring diagram of one embodiment of an optimizing circuit.

As the regulating circuit 20 and the optimizing circuit shown in FIG. 1 to FIG. 3, when different input signals are transmitted through certain matching circuits, the current consumptions are different. In the embodiment, in order to have better illustrate details and features of the present disclosure, three different frequency input signals would be taken as an example. The three different frequency input signals are respectively detected by the detection unit 30 in different channels. The different channels comprise Low channel, Mid channel and High channel as shown in FIG. 4. At first, the three different frequency input signals are transmitted respectively in the different channels. In each matching circuit, the varactor diode biasing voltage is changed to different values according to different conditions. Thus, in different conditions, the current consumption of the three different frequency input signals would be detected. In at least one embodiment, in different matching circuits, transmission line length is not equal. As shown in FIG. 4, in the measuring diagram, transmission lines 202 have different length: L0, L1, L2 and L3; and varactor diode biasing voltages are correspondingly set to be three values: L, M and H. In other embodiments, the varactor diode biasing voltages can be other values.

For example, in FIG. 4, the conditions L0_L means that input signals are transmitted in a matching circuit which transmission line length is L0. The remark L0_L also means that the input signals are transmitted in the matching circuit which varactor diode biasing voltage is low. As shown in FIG. 4, different input signals transmitted in different conditions have different current consumption values. In order to reduce the current consumptions, the switch 201 can correspondingly switch on a matching circuit according to different input signals and the detected different current consumption values. For example, when input signals are transmitted in the Mid channel and the input signals are transmitted in the condition L3_L, the current consumption is a minimum value. The signal unit 10 then outputs corresponding control signals to the switch 201. The switch 201 then switches on the matching circuit which transmission line length is L3 and which varactor diode biasing voltage is low voltage.

In the present disclose, different input signals can be transmitted in a corresponding matching circuit to optimize current consumptions.

Many details are often found in art including other features of the regulating circuit and the optimizing circuit. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An optimizing circuit configured to regulate current consumptions, comprising:
   a signal unit configured to transmit signals and output control signals;
   a first attenuator coupled to the signal unit, wherein the first attenuator is configured to adjust amplitude of signals output from the signal unit;
   a coupler coupled to the first attenuator, wherein the coupler coupled is configured to split the signals;
   a second attenuator coupled to a coupler first terminal;
   a detection unit coupled to the coupler, wherein the detection unit is configured to detect signal statuses of the signals output from the signal unit; and
   a regulating circuit coupled to the signal unit, wherein the regulating circuit is configured to adjust current consumptions, the regulating circuit comprises:
     at least two matching circuits configured to be matched to input signals; and
     a switch coupled to the at least two matching circuits, wherein the switch is configured to select a selected matching circuit and correspondingly switch on the selected matching circuit according to the input signals, when the switch is configured to switch on the selected matching circuit, the selected matching circuit is matched to the input signals.

2. The optimizing circuit as claimed in claim 1, wherein the signal unit is coupled to the regulating circuit through some control buses to control the regulating circuit.

3. The optimizing circuit as claimed in claim 1, wherein the signal unit controls the regulating circuit according to the signal statuses.

* * * * *